(12) United States Patent
Cantey, III et al.

(10) Patent No.: US 6,194,976 B1
(45) Date of Patent: Feb. 27, 2001

(54) MULTIPLE BAND VOLTAGE CONTROLLED OSCILLATOR USING IMPEDANCE SCALING

(75) Inventors: Patrick S. Cantey, III, San Diego; Rolando A. Saldana, Carlsbad; Thomas A. Pitta, San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/280,183

(22) Filed: Mar. 29, 1999

(51) Int. Cl.[7] .................................................. H03B 5/08
(52) U.S. Cl. ......................... 331/167; 331/179; 331/181
(58) Field of Search ........................ 331/117 R, 117 FE, 331/167, 176, 179, 181

(56) References Cited

U.S. PATENT DOCUMENTS

| | | | |
|---|---|---|---|
| 3,889,210 | * | 6/1975 | Matsuura et al. ..................... 331/109 |
| 4,353,038 | * | 10/1982 | Rose et al. .......................... 331/36 C |
| 4,598,423 | * | 7/1986 | Hettiger ................................. 331/179 |
| 5,535,443 | * | 7/1996 | Wignot ................................. 455/196.1 |

FOREIGN PATENT DOCUMENTS

| | | | |
|---|---|---|---|
| 0270298 | 6/1988 | (EP) | ................................. H03B/5/12 |
| 2240227 | 7/1991 | (GB) | ................................. H03J/5/24 |

\* cited by examiner

*Primary Examiner*—Siegfried H. Grimm
(74) *Attorney, Agent, or Firm*—Phillip Wadsworth; Charles Brown; Tom Streeter

(57) ABSTRACT

A multiple band voltage controlled oscillator capable of generating multiple operating frequencies, and a method of generating multiple operating frequencies, includes a tank circuit having a diode element and an impedance element with a radio frequency impedance in parallel with the diode element, a PIN diode connected across a portion of the inductance of the impedance element which selectively shorts the portion of the inductance of the impedance element when activated, a switch connected to selectively enable the PIN diode and correspondingly partially short the inductance of the impedance element, thereby scaling the radio frequency impedance of the tank circuit, and an oscillator circuit responsively connected to the PIN diode for varying the output of the voltage controlled oscillator based on the radio-frequency impedance present.

2 Claims, 3 Drawing Sheets

MULTIPLE BAND VOLTAGE CONTROLLED OSCILLATOR USING IMPEDANCE SCALING

BACKGROUND OF THE INVENTION

I. Field of the Invention

The present invention is directed generally to an apparatus and method for voltage controlled oscillation and, more particularly, to a multiple band voltage controlled oscillator using impedance scaling, and a method of providing multiple bands for a voltage controlled oscillator.

II. Description of the Background

Mobile telephone receivers typically require the use of a voltage controlled oscillator (VCO) with a specific center frequency in order to process incoming signals. In mobile telephones that are adapted to operate in multiple modes, separate voltage controlled oscillator circuits, each of which has a center frequency associated with one of the modes, are typically required to be present in the telephones in order to process received signals in the multiple modes.

The use of multiple VCO circuits in multiple mode telephones increases the number of components required to implement such devices, and such circuits occupy valuable space on the circuit boards used for implementing the telephone. It would therefore be desirable to eliminate the need for multiple, separate VCO's in multiple mode phones.

BRIEF SUMMARY OF THE INVENTION

The present invention is directed to a multiple band voltage controlled oscillator (VCO) using impedance scaling. In one embodiment of the present invention, the multiple band voltage controlled oscillator includes a tank circuit, which includes diodes, a capacitance, and an inductance, a PIN diode connected across part of the inductance of the tank circuit, a switch connected to selectively enable the PIN diode and correspondingly partially short the inductance of the tank circuit, and an oscillator circuit responsively connected to the PIN diode. Toggling of the switch causes the center frequency associated with the operating frequency range of the VCO to shift between two values, $f_1$ and $f_2$. More particularly, actuation of the switch causes the inductance associated with the VCO to vary, thereby shifting the center frequency of the VCO between the $f_1$ and $f_2$ values.

The present invention also includes a method of providing multiple bands for a voltage controlled oscillator. The method includes providing a tank circuit with a radio frequency impedance, adjusting the radio frequency impedance of the tank circuit by selectively shorting a portion of the radio-frequency impedance using a PIN diode activated by a switch, and varying the output of the voltage controlled oscillator based on the radio-frequency impedance present using a base band oscillator.

The present invention solves problems experienced with the prior art. The use of multiple sets of frequency generating circuitry is avoided by the use of the present invention, thus avoiding the corresponding increased materials cost, degradation of performance, and variable sensitivity parameters. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical voltage controlled oscillator. Those of ordinary skill in the art will recognize that other elements are desirable and/or required in order to implement the present invention. However, because such elements are well known in the art, and because they do not facilitate a better understanding of the present invention, a discussion of such elements is not provided herein.

Figure 1:
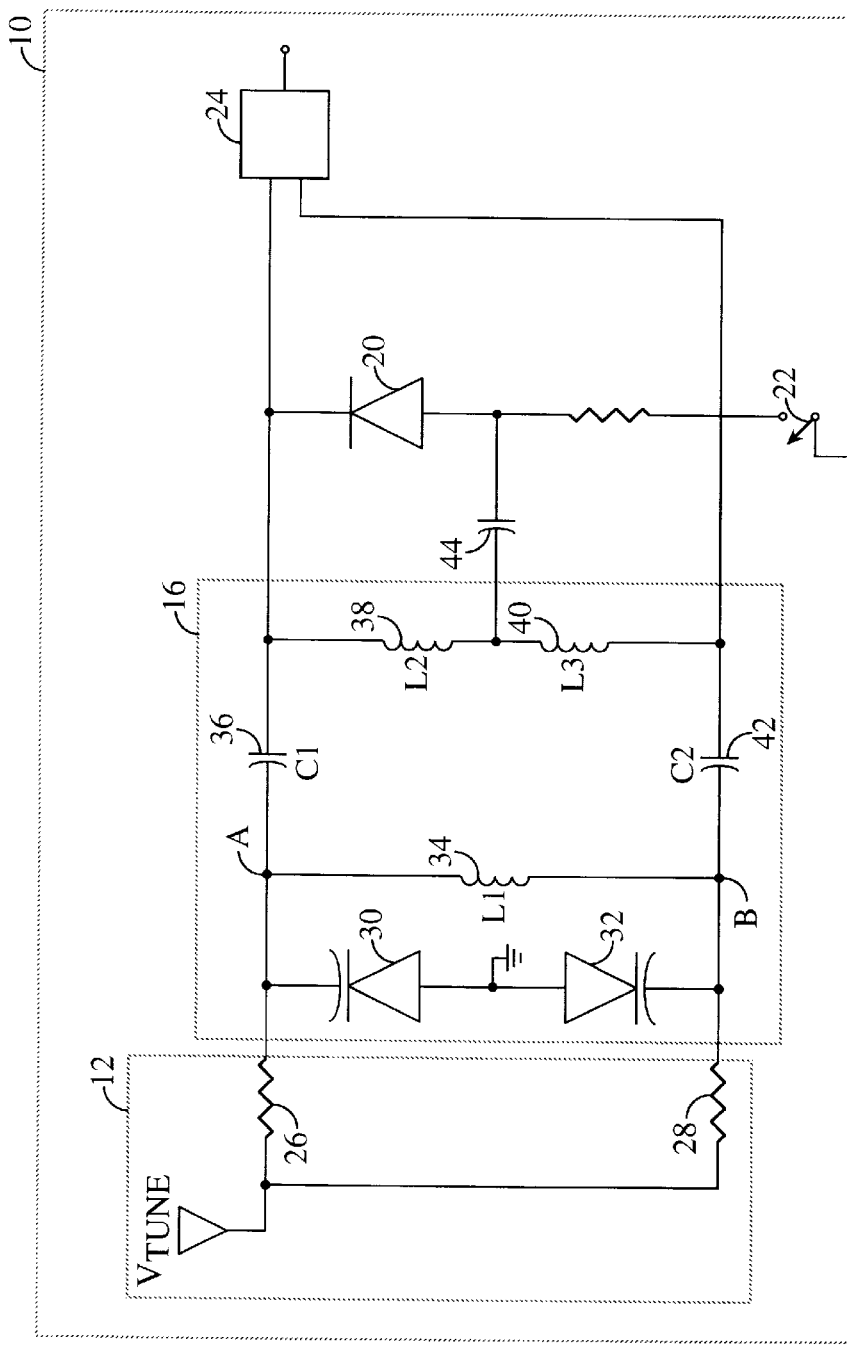
FIG. 1 is a circuit schematic illustrating a multiple band voltage controlled oscillator.

FIG. 1 is a circuit schematic illustrating a multiple band voltage controlled oscillator (VCO) 10. The multiple band VCO includes a DC tuning voltage circuit 12, a tank circuit 16, a PIN diode 20, a switch 22, and an oscillator 24.

The DC tuning voltage circuit 12 includes a tuning voltage, $V_{TUNE}$, and may include two resistors 26, 28 connected to the tuning voltage. Variations in $V_{TUNE}$ cause the frequency of the VCO to shift about the VCO's center frequency in accordance with the $K_v$ of the circuit, as discussed hereinbelow. The resistors 26, 28 are chosen to provide a greater impedance across nodes A and B looking from A and B toward $V_{TUNE}$ than the impedance provided looking from A and B into the tank circuit 16. In the present embodiment, the tuning voltage may be varied from 0–3 Volts. The DC tuning voltage circuit 12 is used to adjust the present invention for variations in the components and variations due to temperature.

The tank circuit 16 includes a diode element, which, in the illustrated embodiment, includes two diodes 30, 32 connected anode to anode. The diodes 30, 32 are connected across the DC tuning voltage circuit 12, or, in the embodiment wherein resistors 26, 28 are present, across the resistors 26, 28 in the DC tuning voltage circuit 12. The diodes 30, 32 used in the present invention may be of a varactor type.

The tank circuit 16 also includes an impedance element which, in the illustrated embodiment, includes an inductor 34. In embodiments of the present invention not illustrated, the tank circuit 16 may include within the impedance element any combination radio-frequency impedance which includes an inductor at 34. The inductor 34 is connected in parallel across the diodes 30, 32.

Figure 2:
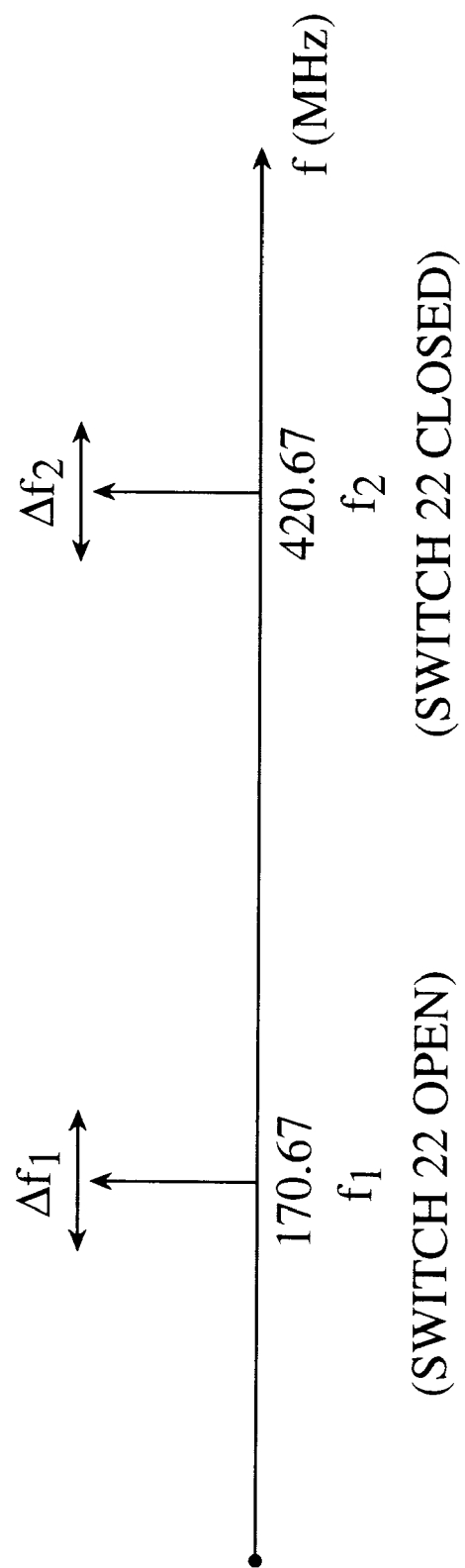
FIG. 2 is a spectrum diagram of the frequency response of a multiple band voltage controlled oscillator.

The sensitivity parameter ($K_v$) of the VCO is a measurement of the amount of oscillation frequency change per volt change in the tuning voltage ($V_{TUNE}$), thereby constituting a measure of the ability of the multiple band voltage controlled oscillator 10 to vary frequency about either $f_1$ or $f_2$ for a given range of $V_{TUNE}$ values, as shown in FIG. 2. As discussed hereinbelow, the value of the tank circuit inductor 34, $L_1$, is chosen to maintain a relatively constant (within a given allowable $\Delta f$ range, as discussed with respect to FIG. 2) sensitivity parameter. Improper selection of a value for $L_1$ may cause an undesired variation in the sensitivity parameter as the center frequency is switched from $f_1$ to $f_2$.

In the illustrated embodiment of the present invention, the tank circuit also includes a capacitor 36, two inductors 38, 40, and a second capacitor 42 in series, placed in parallel with the inductor 34. In alternate embodiments, the tank circuit 16 may have any number of capacitors at 36 and 42, and one or more inductors at 38 and 40, and may also include resistors. Furthermore, in all embodiments, the impedance of the capacitors 36, 42 should be maintained at a low level, in order to prevent coupling.

The PIN diode 20 is connected in parallel with a portion of the inductance 38 present in the tank circuit 16 and is used to selectively approximate a short across that portion of that inductance 38. When the PIN diode 20 is in the active state, the impedance present in the PIN diode leg 20 of the VCO 10 is the low resistance of the PIN diode 20. No radio-frequency impedances are present in the PIN diode leg. Consequently, the PIN diode 20 leg presents a significantly lower impedance path than the parallel inductance 38 of the tank circuit 16, where the frequency is sufficiently high that the decoupling capacitor 44 is approximately shorted out. This causes an approximate short across the inductance 38. When the PIN diode 20 is not in the active state, it approximates an open circuit. Thus, when the PIN diode 20 is inactive, the lowest resistance path for current is through the inductance 38 in parallel with the PIN diode 20. In this manner, the present invention allows a variation in the impedance available within the VCO without changing components, and thus provides impedance scaling.

In the manner stated hereinabove, activation of the PIN diode 20 allows for selective removal of a portion of the inductance 38 of the tank circuit 16, which is an LC filter, and that removal, in turn, changes the operating frequency of the VCO 10 between $f_1$ and $f_2$ (as shown in FIG. 2). The available operating frequencies are dependent on the impedance scale available, and that impedance scale is dependent on the values chosen for the capacitance 36, 42 of the tank circuit 16, the entire inductance 38, 40 chosen for the tank circuit 16, and the value of the total inductance 38 which may be shorted by the parallel PIN diode 20. The center operating frequency ($f_1$, $f_2$) is changed through activation or deactivation of the PIN diode 20. In an exemplary embodiment of the present invention, where the value of capacitor 36 is 9 picoF, where the value of capacitor 42 is 9 picoF, where the value of inductor 38 is 150 nanoH, and where the value of inductor 40 is 27 nanoH, two center operating frequencies are made available, 170.67 MHz and 420.67 Mhz. Other frequencies may be chosen, and may be more than two in number.

Activation of the PIN diode 20 is controlled by the switch 22. The switch 22 is used to selectively enable the PIN diode 20. The switch 22 used is of the type used in the art, and may be implemented using transistors. Bipolar junction transistors (BJT) or a field effect transistors (FET) may be used to implement the switch 22.

The switch 22 may be user activated, or it may be activated by a control system, such as a hardware reception sensor or a software program. For example, in a telephone application, the telephone may default to a frequency corresponding to a PCS mode of operation. However, when the user or the control system senses that reception on the telephone becomes unclear or a connection cannot be made, the switch will cause the telephone to switch to an alternate frequency mode of operation, such as AMPs.

The oscillator 24 is responsively connected across the tank circuit 16. The oscillator 24 may be, but is not limited to, a base band oscillator. The base band oscillator oscillates at a given frequency when that frequency is presented at its terminals. Thus, in the present embodiment, the PIN diode 20 and the $V_{TUNE}$ value control the oscillation frequency of the oscillator 24. More particularly, PIN diode 20 controls the value of the inductance 38 present in the tank circuit 16, and hence controls the impedance scale. The value of the inductance 38 in the impedance scale and $V_{TUNE}$ control the resonant frequency of the tank circuit 16, which is an LC circuit. That resonant frequency, when placed at the terminals of the oscillator 24, causes the oscillator 24 to oscillate at that frequency. The oscillator 24 of the present invention may be operated in balanced or unbalanced mode.

FIG. 2 is a spectrum diagram of the frequency response of the multiple band voltage controlled oscillator. Two available center operating frequencies are shown in the diagram as peaks $f_1$ and $f_2$ at 170.67 MHz and 420.67 Mhz, respectively. The 170.67 MHz peak is the low operating band, and is obtained when the PIN diode 20 is open, placing both tank circuit inductors 38, 40 into the VCO 10. The 420.67 MHz peak is the high operating band, and is obtained when the PIN diode 20 is closed, shorting a tank circuit inductance 38 of large inductance value. The $\Delta f$ value is the variation in center operating frequency allowable around the peak frequency. The DC voltage tuning circuit 12 (i.e. $V_{TUNE}$) is used to adjust the operating frequency of the VCO in an allowable range ($\Delta f$) about each of the center frequencies, $f_1$ and $f_2$.

As mentioned above, variations in the $V_{TUNE}$ value cause the frequency of the VCO to shift about one of the VCO's center frequencies (i.e. either $f_1$ or $f_2$) in accordance with the $K_v$ of the circuit. The sensitivity parameter, $K_v$, is directly related to the performance characteristics of the system and is dependant on the relative values of the R, L, and C impedances in the tank circuit 16. The sensitivity parameter changes as a percentage change in the R, L and C values of the tank circuit 16. In the preferred embodiment, the R, L, and C values are selected such that the $K_v$ value of the VCO increases only minimally as the center operating frequency increases from $f_1$ to $f_2$. The R, L, and C values selected to achieve such $K_v$ values are a matter of design choice, and may be selected empirically using circuit simulation software. In an exemplary embodiment, the desired sensitivity parameter is approximately 30 MHz/Volt.

Figure 3:
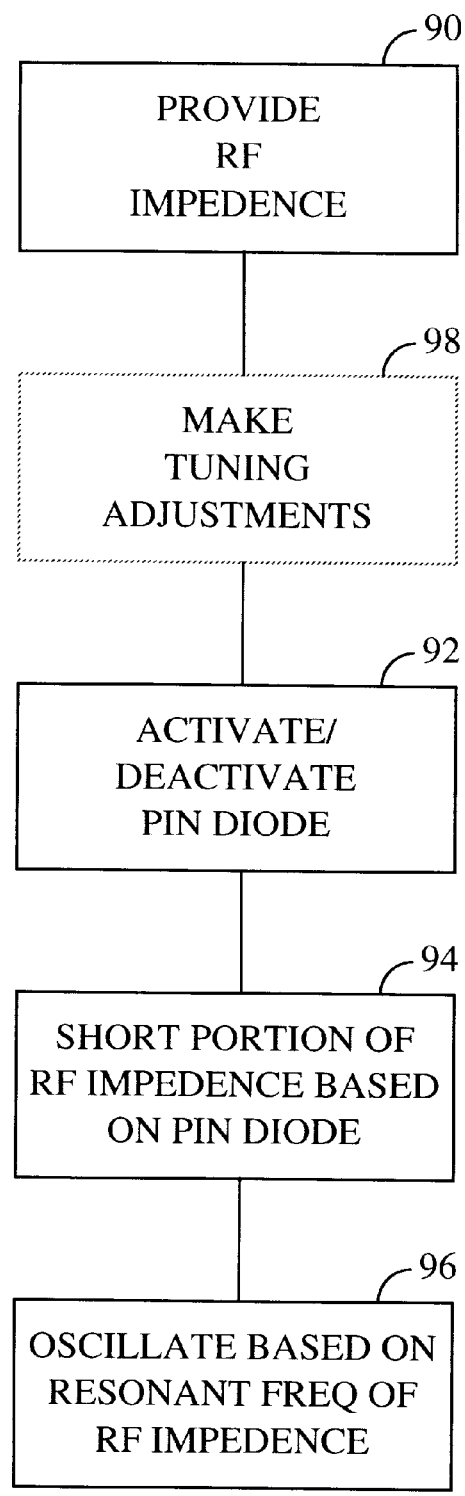
FIG. 3 is a block diagram illustrating a method of switching between multiple bands of a voltage controlled oscillator.

FIG. 3 is a block diagram illustrating a method for switching between multiple bands of a VCO using the present invention. The method includes providing an impedance circuit with a radio-frequency impedance, at step 90.

At step 92, the PIN diode is activated by a switch to selectively short a portion of the radio-frequency impedance. At step 94, the radio frequency impedance of the impedance circuit is selectively adjusted based on activation of the PIN diode.

At step 96, the frequency output of the VCO is changed based on the radio-frequency impedance present in the impedance circuit.

The method of the present invention may also include tuning the VCO to account for temperature differences or component variations. The tuning is shown at optional step 98.

Those of ordinary skill in the art will recognize that many modifications and variations of the present invention may be implemented. For example, the multiple band voltage controlled oscillator (VCO) could be replicated, using multiple PIN diodes to short out multiple inductances in turn, allowing for any number of operating frequencies. Further, the present invention could be used in a wireless telephone application, computer motherboard application, or any application which might necessitate multiple operating frequencies. The foregoing description and the following claims are intended to cover all such modifications and variations.

What is claimed is:

1. A multiple band voltage controlled oscillator capable of generating multiple operating frequencies, comprising:
   a tank circuit including a diode element, in parallel with an impedance element including an inductance, wherein the impedance element includes a first capacitor connected in series to a second inductor, the second inductor being connected in series to a third inductor, and the third inductor being connected in series to a second capacitors;
   a PIN diode connected across a portion of the inductance of said tank circuit;
   a switch connected to selectively enable said PIN diode and correspondingly partially short the portion of the inductance of said tank circuit; and
   an oscillator circuit responsively connected to said PIN diode.

2. A multiple band voltage controlled oscillator for use in a wireless telephone, comprising:
   a DC voltage tuning circuit;
   a pair of resistors connected in series with the tuning voltage;
   a first varactor diode and a second varactor diode, each varactor diode having an anode and a cathode, the anode of said first varactor diode being connected to the anode of said second varactor diode forming a series varactor diode circuit, the series varactor diode circuit being connected between said pair of resistors;
   a first inductor having a first lead and a second lead and being connected in parallel across the series varactor diode circuit;
   a first capacitor connected to the first lead of said first inductor;
   a second capacitor connected to the second lead of said first inductor;
   a second inductor connected to said first capacitor;
   a third inductor connected between said second inductor and said second capacitor;
   a PIN diode connected at an interconnect point to a low impedance capacitor, the PIN diode and low impedance capacitor connection being made in parallel with said second inductor;
   a resistor switchably connected between a bias voltage and the interconnect point of said PIN diode and said low impedance capacitor; and
   a base band oscillator connected in parallel with the second inductor and third inductor connection.

* * * * *